(12) United States Patent
Cazals

(10) Patent No.: US 9,324,513 B2
(45) Date of Patent: Apr. 26, 2016

(54) METHOD FOR EVALUATING THE MECHANICAL PERFORMANCES OF A SWITCHGEAR DEVICE AND SWITCHGEAR DEVICE FOR IMPLEMENTATION OF SAID METHOD

(71) Applicant: Schneider Electric Industries SAS, Rueil Malmaison (FR)

(72) Inventor: Francois Cazals, Claix (FR)

(73) Assignee: SCHNEIDER ELECTRIC INDUSTRIES SAS, Rueil Malmaison (FR)

( * ) Notice: Subject to any disclaimer, the term of this patent is extended or adjusted under 35 U.S.C. 154(b) by 347 days.

(21) Appl. No.: 14/022,974

(22) Filed: Sep. 10, 2013

(65) Prior Publication Data

US 2014/0069784 A1 Mar. 13, 2014

(30) Foreign Application Priority Data

Sep. 10, 2012 (FR) ...................................... 12 58458

(51) Int. Cl.
*H01H 11/00* (2006.01)
*H01H 9/00* (2006.01)
(Continued)

(52) U.S. Cl.
CPC ......... *H01H 11/0062* (2013.01); *H01H 1/0015* (2013.01); *H01H 9/00* (2013.01);
(Continued)

(58) Field of Classification Search
CPC ........... G01R 31/3274; H01H 11/0062; H01H 2071/044; H01H 2071/048; H01H 2009/0088
See application file for complete search history.

(56) References Cited

U.S. PATENT DOCUMENTS

2009/0102468 A1 4/2009 Takahashi
2010/0107747 A1* 5/2010 Rolew ................... F02D 41/009
73/114.26

(Continued)

FOREIGN PATENT DOCUMENTS

EP 0 222 645 A1 5/1987
EP 0 789 380 A1 8/1997
(Continued)

OTHER PUBLICATIONS

French Preliminary Search Report issued May 3, 2013 in French 12 58458, filed on Sep. 10, 2012 (with English Translation of Category of Cited Documents).

*Primary Examiner* — Paul West
(74) *Attorney, Agent, or Firm* — Oblon, McClelland, Maier & Neustadt, L.L.P.

(57) ABSTRACT

The invention relates to a method for evaluating the mechanical performances of a switchgear device comprising at least one pole. Each pole comprises:
 a pair of contacts (12, 14);
 a support arm (16) for a first contact (14);
 a mechanism (22) for driving the support arm (16) comprising a rotary poles shaft (20) and energy accumulation means capable of driving a movement of the said arm in order to place the contacts (12, 14) in an open position.
The method consists in:
 measuring the angle of rotation (θ) of the poles shaft (20) over a period of opening the contacts (12, 14);
 retrieving from the measurements at least one specific value;
 comparing the said specific value with specific initial operational specifications of the switchgear device;
 diagnosing the mechanical wear performances of the drive mechanism (22) as a function of a comparative state between the specific values obtained and those of the operational specifications.

10 Claims, 6 Drawing Sheets

(51) Int. Cl.
   *H01H 1/00*   (2006.01)
   *H01H 71/04*  (2006.01)
   *G01R 31/327* (2006.01)
   *H01H 1/22*   (2006.01)
   *H01H 71/52*  (2006.01)

(52) U.S. Cl.
   CPC ........... *H01H 71/04* (2013.01); *G01R 31/3274* (2013.01); *H01H 1/225* (2013.01); *H01H 71/526* (2013.01); *H01H 2071/044* (2013.01); *H01H 2071/048* (2013.01)

(56) References Cited

U.S. PATENT DOCUMENTS

2010/0288606 A1   11/2010   Rival
2012/0053886 A1    3/2012   Poeltl

FOREIGN PATENT DOCUMENTS

| EP | 1 347 479 A1 | 9/2003 |
| EP | 1 921 423 A1 | 5/2008 |
| EP | 2 254 136 A1 | 11/2010 |

* cited by examiner

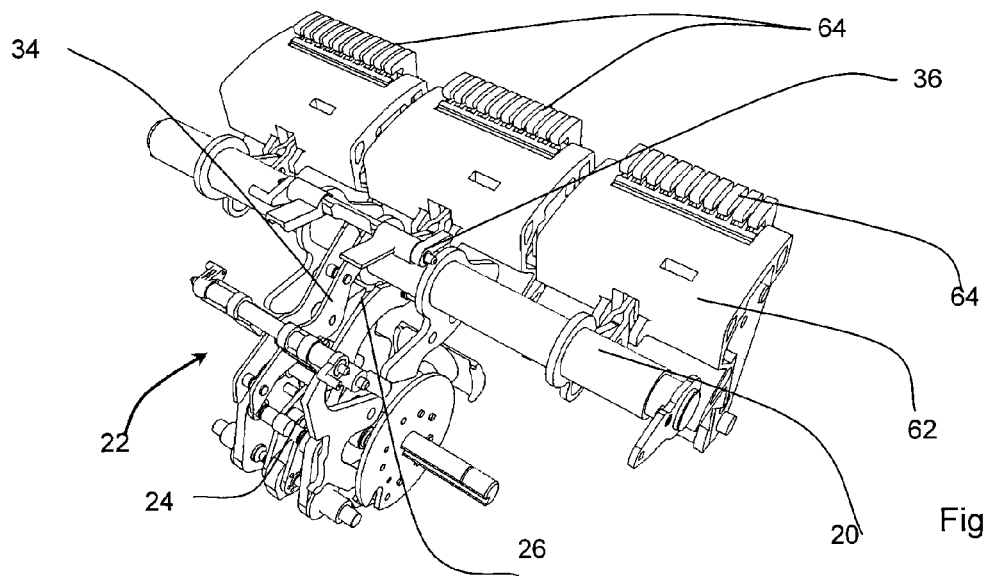
Fig. 2
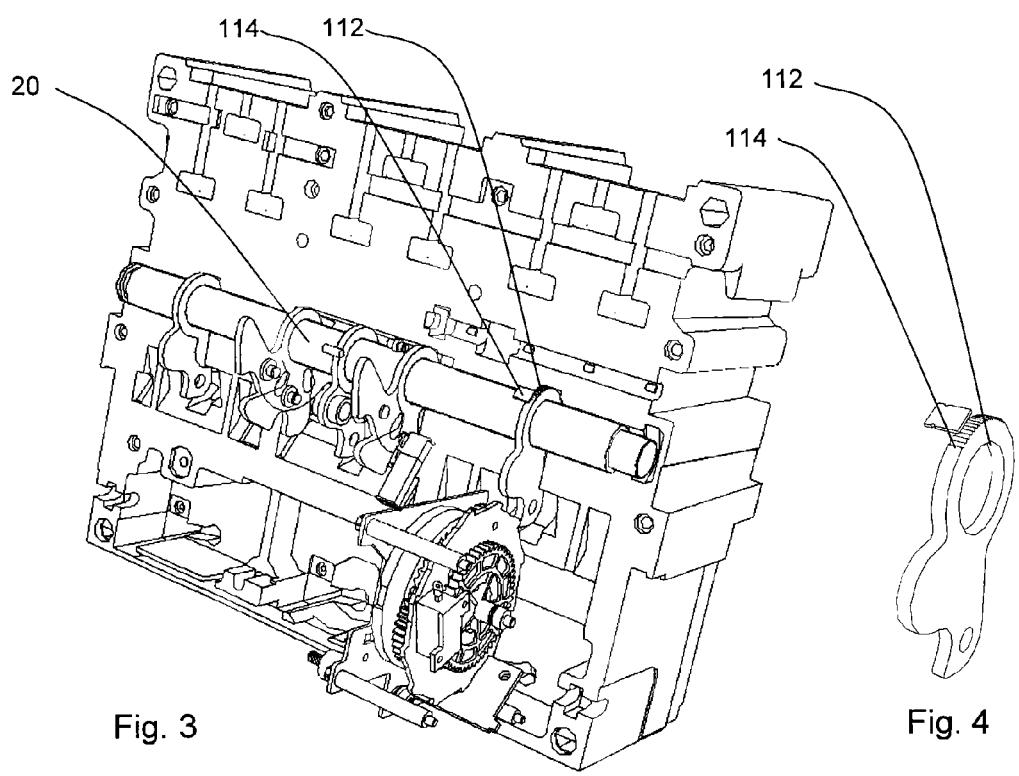
Fig. 3
Fig. 4

METHOD FOR EVALUATING THE MECHANICAL PERFORMANCES OF A SWITCHGEAR DEVICE AND SWITCHGEAR DEVICE FOR IMPLEMENTATION OF SAID METHOD

The invention relates to a method for evaluating the mechanical performances of a switchgear device comprising at least one pole.

The invention also relates to a switchgear device for implementation of the method. The device comprises at least one pole having a pair of contacts that are mobile with respect to each other between an open position and a closed position. Each pole furthermore comprises a support arm for a first contact. A mechanism for driving the support arm comprises a rotary poles shaft and at least one rod which couples the drive mechanism to the support arm in a pivoting manner. Energy accumulation means are capable of driving a movement of the said arm in order to place the contacts in an open position.

PRIOR ART

A power supply line of an electric load to be controlled is conventionally provided with at least one switchgear device. This switchgear device comprises, for each phase, pairs of contacts which are mobile with respect to each other in order to switch the load.

The actuation of the mobile contacts can be carried or in different ways.

Certain high power switchgear devices, notably used for switching electric currents of magnitude greater than 600 A necessitating high electromagnetic strength comprise contacts driven by a lever system coupled with a rotary shaft which is itself actuated by a toggle mechanism with two pivoting links. These switchgear devices notably described in the documents EP 0 222 645, EP 0 789 380 and EP 1 347 479 are used for example for safety and are placed at the start of a line.

These high power switchgear devices are provided for functioning according to a number of open-close operations that is foreseen and fixed by the manufacturer. The open-close cycles can be carried out off load, in which case the mechanical endurance is considered. They can also be carried out with nominal load, in which case electrical endurance is considered.

The repeated number of open-close operations causes wear of the contact pads. The wear of the contacts is characterized by a removal of material and/or a crushing of material. This wear of the contacts has an effect on the electro-technical performances of the switchgear device, notably by changing its electrodynamic strength and causing temperature rise.

In order to evaluate the wear of the contacts, it is known to use an indicator directly engraved on the poles cage. This indicator makes it possible to observe the relative play of the contact fingers with respect to the poles cage. This inspection method has the disadvantage of being able to be used only during an operation of maintenance of the device. This maintenance operation necessitates switching off the switchgear device notably with a removal of the filters from the switchgear housings.

DESCRIPTION OF THE INVENTION

The purpose of the invention is therefore to overcome the disadvantages of the prior art in such a way as to propose a method of diagnosis and evaluation of the mechanical performances of a switchgear device, notably the wear of the electrical contacts performances.

The method according to the invention consists in measuring the angle of rotation of the poles shaft over a period of opening the contacts. At least one specific value is retrieved from these measurements. The said specific value is compared with a specific initial operational specification of the switchgear device. The mechanical wear performances of the drive mechanism are diagnosed according to a comparative state between the specific values obtained and those of the operational specifications.

According to a first development of the invention, the method consists in determining a first specific value equal to a first angle necessary for reaching a first point of inflection on a curve of variation of the angle of rotation of the poles shaft. The said point of inflection corresponds to the moment at which the poles shaft reaches a maximum speed of rotation and where the electrical contacts lose contact. The said specific value is then compared with a theoretical reference value extracted from specific initial operational specifications of the switchgear device. The wear of the electrical contacts is diagnosed according to a comparative state between the determined specific value and the theoretical reference value taken from the operational specifications.

According to a second development of the invention, the method consists in determining a second specific value equal to a first time necessary for reaching a first point of inflection on a curve of variation of the angle of rotation, the said point of inflection corresponding to the moment at which the poles shaft reaches a maximum speed of rotation. A third specific value equal to a second time necessary for reaching a second point on the curve of variation of the angle of rotation is determined. The said second point corresponds to a theoretical final angle of rotation reached when the main pair of mobile contacts is in an open position. The time elapsed between the first and second times is calculated and is compared with a reference value representing the operation of a switchgear device that is not worn. The wear of the electrical contacts is finally diagnosed according to a comparative state between the determined specific values and those taken from the operational specifications.

The switchgear device according to the invention comprises a plurality of identical poles and a poles shaft common to all of the poles, the poles shaft being the axis of rotation of the drive mechanisms.

According to one development of the device, the support arm of a first contact comprises a first part carrying the first contact and a second part, the two parts sliding with respect to each other so that, in the closed position of the pair of contacts, the second part can take up a first docking position and a second end of travel position in which the first part is inserted in the second part.

Preferably, the drive mechanism of the poles shaft comprises a toggle device coupled with a tripping hook and an opening spring in order to move the support arm of the mobile contact, the device comprising two links.

Advantageously, the drive mechanism of the poles shaft comprises a reset device having an energy accumulator system with an elastic device comprising at least one closing spring in order to move the mobile contact towards the closed position, the setting of the closing spring being operated by a resetting cam driven in rotation by means of a manual lever or by a servomotor.

The switchgear device comprises means of determination of the angle of rotation of the poles shaft, the said means comprising a rotation sensor of which one component is disposed on the poles shaft.

Advantageously, the rotation sensor comprises magnetic means disposed on the axis of rotation and detection means positioned on the casing of the switchgear device, the magnetic and detection means communicating without contact.

Advantageously, the rotation sensor comprises a toothed wheel disposed on the axis of rotation and means of detection placed on the casing of the switchgear device, the toothed wheel and detection means communicating without contact.

BRIEF DESCRIPTION OF THE FIGURES

Other advantages and features will emerge more clearly from the following description of particular embodiments of the invention, given by way of indication and in no way limiting and shown in the appended figures.

FIG. 2 shows a detailed view in perspective of the drive mechanism of a switchgear device according to FIG. 1;

FIG. 3 shows another detailed view in perspective of the drive mechanism of a switchgear device according to FIG. 1;

FIG. 4 shows a detailed view in perspective of the rotation sensor 70 of a switchgear device according to FIG. 1;

DETAILED DESCRIPTION OF A PREFERRED EMBODIMENT

Figure 1:
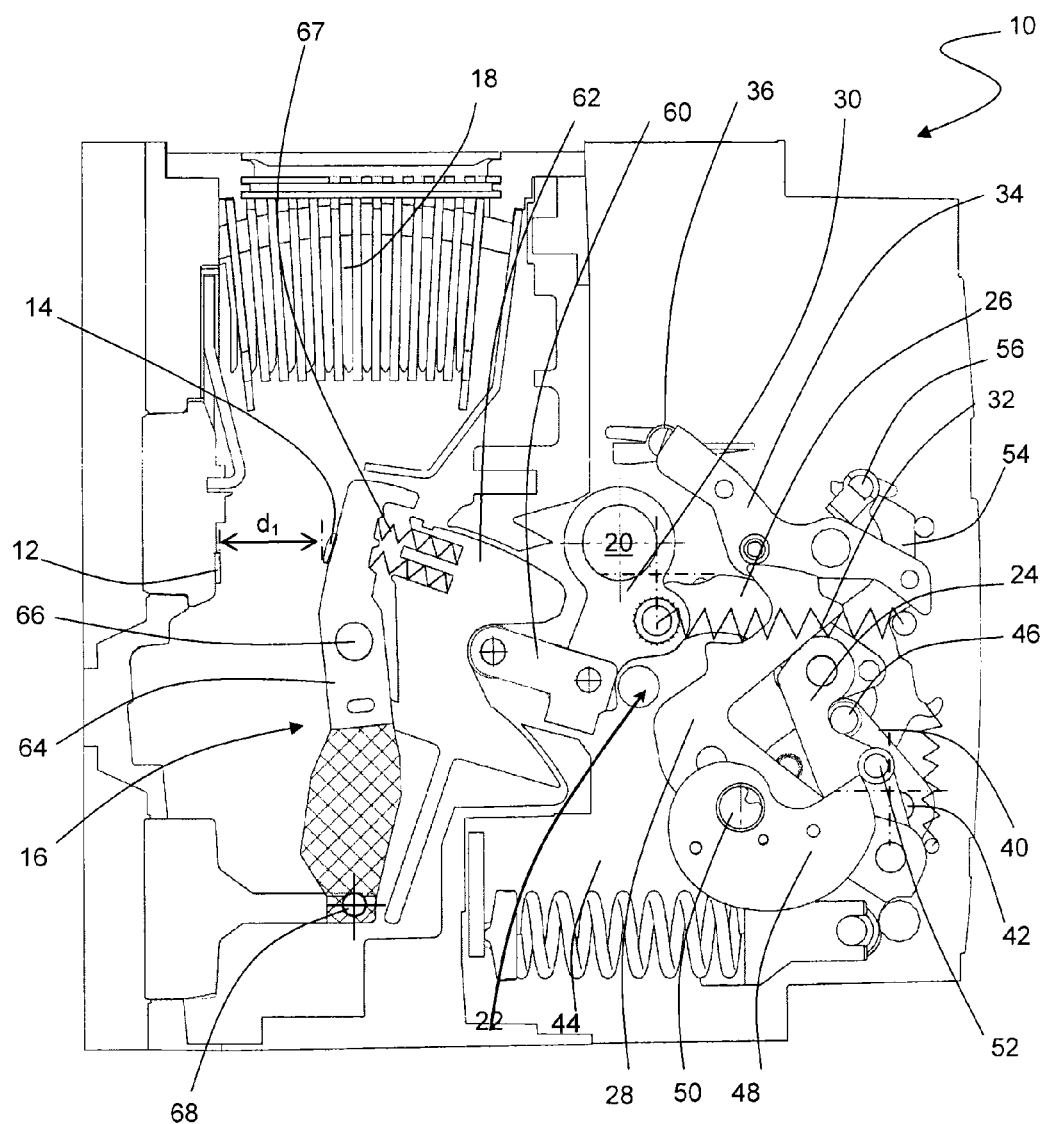
FIG. 1 shows a switchgear device for implementation of the method according to the invention.

With reference to FIG. 1, a switchgear device 10 for high currents, higher than 600 A, comprises, for each pole and in a conventional way, a pair of electrical contacts 12, 14. Each electrical contact is preferably associated with a pad of appropriate material, for example a silver alloy. One of the contacts 14 is mounted on an arm 16 pivoting between an open position, in which it is distant from the fixed contact 12, and a closed position in which the mechanical and electrical contact between the contacts 12, 14 is established. The pole also comprises an arc-quenching chamber 18 and a pair of main terminals (not shown) intended to be mounted on connection areas. For these high ranges, the switchgear device 10 comprises a plurality of poles disposed in parallel planes, perpendicular to a poles shaft 20 which is common to them: the command to close or open the poles is transmitted to each mobile contact 14 from the poles shaft 20 by the intermediary of a lever drive mechanism 22 (FIGS. 1 and 2).

The poles shaft 20 is mounted in a rotary manner on the casing of the switchgear device 10 and is actuated by appropriate means. In particular, for open switchgear devices 10 with an intermediate poles shaft 20 and high electro-dynamic strength, the drive mechanism 22 is of the toggle type, with two links 24, 26 pivoting with respect to each other. One of the links 24 is rotationally articulated on a tripping hook 28 mounted in a pivoting manner on a fixed axis; the other link 26 is mechanically coupled with a crank 30 of the poles shaft 20, this also being common to all of the poles and furthermore forming one of the levers of the drive mechanism 22 of the electrical contacts.

An opening spring 32 is anchored between the crank 30 and a fixed retaining latch, and tends to return the crank 30 to its open position. An opening pawl 34, formed by a lever pivoting about a fixed axis, is driven by a half-moon shaped opening bolt 36; the opening pawl 34 is pushed towards the tripping hook 28, moving away from the half-moon 36. A roller is formed on the opening pawl 34 between its ends, in order to cooperate with a V-shaped recess of the tripping hook 28, which is returned by a spring (not shown) tending to shorten the distance between the axis of articulation of the toggle mechanism 24, 26, on the tripping hook 28 and the axis of articulation of the toggle mechanism on the crank 30.

In a preferred embodiment, Ie switchgear device 10 is able to be reset, that is to say it is provided with an energy accumulator to assist the closing function, such as for example a "grenade" mechanism such as described in the document EP 0 222 645. In particular, a drive lever 40 is mounted such that it pivots about a fixed axis 42, and an elastic energy accumulation device comprising at least one closing spring 44 is fitted in a pivoting manner on a fixed point and to a finger of the drive lever 40. The drive lever 40 carries a roller 52 intended to cooperate with a setting cam 48 keyed onto a shaft 50. The roller 52 is able to cooperate with a closing pawl 54 pivoting about a fixed axis. A closing bolt 56, able to lock the pawl 54, is elastically returned by a spring towards its closed position; the pawl 54 is itself returned by a spring to its locked position.

The poles shaft 20 is actuated by the intermediary of different elements and then drives the mobile contacts 14. For this purpose, its crank 30 is provided, for each pole, with a connecting rod 60 which connects it to the support arm 16 of the mobile contact 14. The support arm 16 is provided with two parts that slide with respect to each other: a poles cage 62 is moved directly by the rod 60 with respect to which it is mounted in a pivoting manner. The part 64 of the arm 16 which carries the contact pad 14 slides inside the poles cage 62, preferably in an articulated manner about an axis 66; spring-forming means 67, for example one or more contact pressure springs, arranged between the support 64 and the poles cage 62 push the pad 14 to a protruding position with respect to the cage. This configuration allows an additional travel of the contact pad 14 with respect to the docking, such that in the position of flow of current between the contacts 12, 14, the poles cage 62 can continue its movement without accentuating the pressure on the contact pads 12, 14. The arm 16 is thus mounted in a pivoting manner by its cage 62 about a first axis 68 between the closed position and the open position, and the support 64 of the mobile contact 14 is articulated on a second axis 66 of the cage 62.

Moreover, in the embodiment shown, the toggle system 24, 26 connected to the offset poles shaft 20 allows a reduction of movements. In particular, the total travel or the final angle or rotation $\theta_{final}$ the poles shaft 20, fixed and determined by the design of the of device, is of the order of 50 to 55°.

Figure 5A:
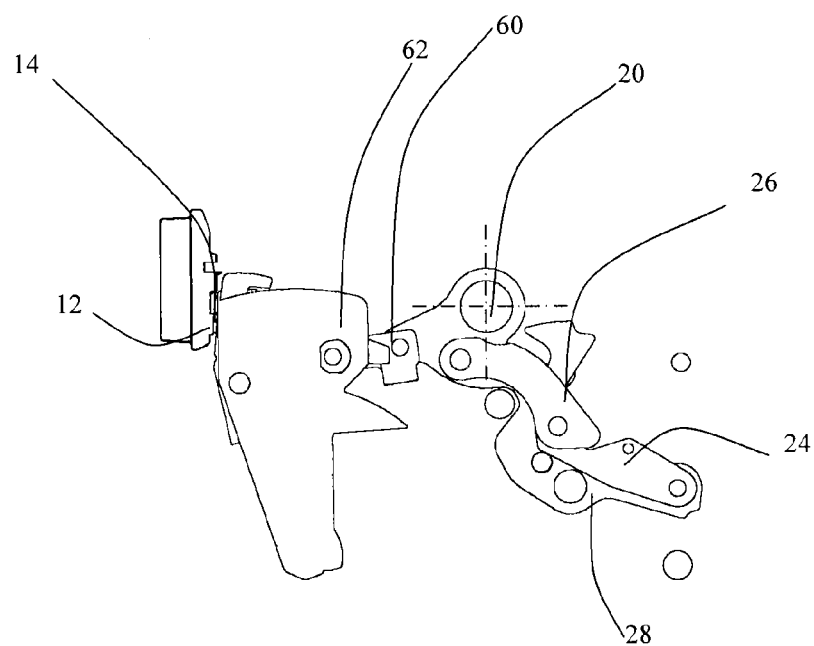
FIGS. 5A-5C show a drive mechanism according to FIG. 2 during the opening stages.

As shown in FIG. 5A, the starting point of the drive mechanism 22 is its position in the closed state. In this state, the mobile contacts 14 are pressed against the fixed contacts 12 and the contact pressure springs 67 are compressed, providing the contact pressure necessary for the conduction of the electric current.

The contact pressure force is transmitted through the drive mechanism 22 via the pole cage 62, the links 60, the cranks 30 and the linkage 26, 24 which is held against a roller connected to the hook 28. The mechanical forces are also taken up by the pivot connection between the lower rod 24 and the hook 28.

The mechanical contact pressure force has a natural tendency, via the taking up of forces through the whole of the drive mechanism, to pivot the hook 28 on its axis of rotation, thus causing the opening of the mechanism. In order to ensure that the drive mechanism 22 is kept in the closed position, a roller connected to the lever 34 stops its rotation. The lever 34 is itself held in position via the half-moon 36, actuated by actuators that are not shown.

Figure 5B:
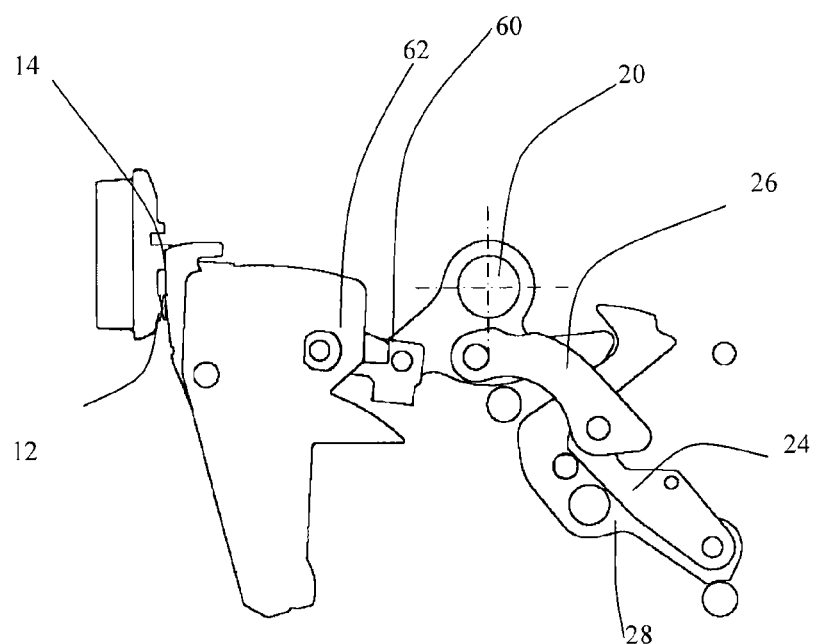
Figure 5C:
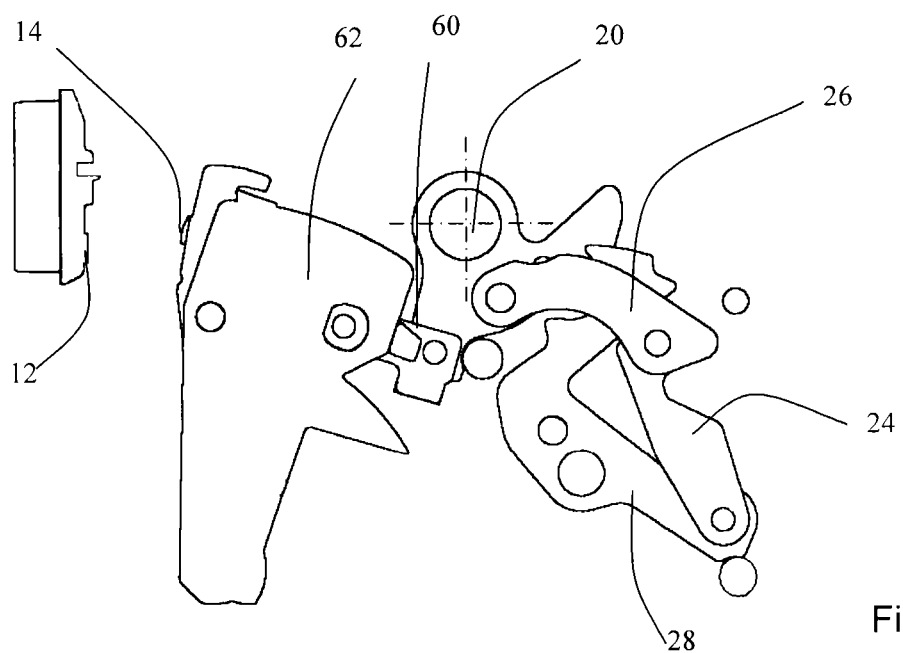

During the opening phase, an electromagnetic or mechanical actuator which is not shown causes the half-moon 36 to pivot. The rotation of the half-moon 36 cancels the pressing of the lever 34 which, under the force of the hook 28, pivots about its axis of rotation. The rotation of the lever 34 removes the support of the hook 28. No longer being held, the latter can then pivot on its axis of rotation under the effect of the contact pressure forces 67 and of the return springs 32. As seen in FIG. 5B, the rotation of the hook 28 makes it possible to beak up the rod assembly 24, 26 and thus releases the mechanism, furthermore ensuring its opening.

According to the invention, a sensor 70 measures the rotation of the poles shaft 20 between the start of the movement of the poles shaft 20, and the end of travel of the said shaft 20. The end of travel of the poles shaft 20 corresponds to the open position of the electrical contacts 12, 14. The sensor 70 also measures the rotation θ of the poles shaft 20 between the time when the mobile and fixed contacts 12, 14 are in a closed position and the time at which the said contacts are in an open position.

The behavioural properties of the drive mechanism 22 during opening are related to the fact that the return force of the springs 32 is negligible compared with the cumulative force of all the contact pressure springs 67.

Figure 7:
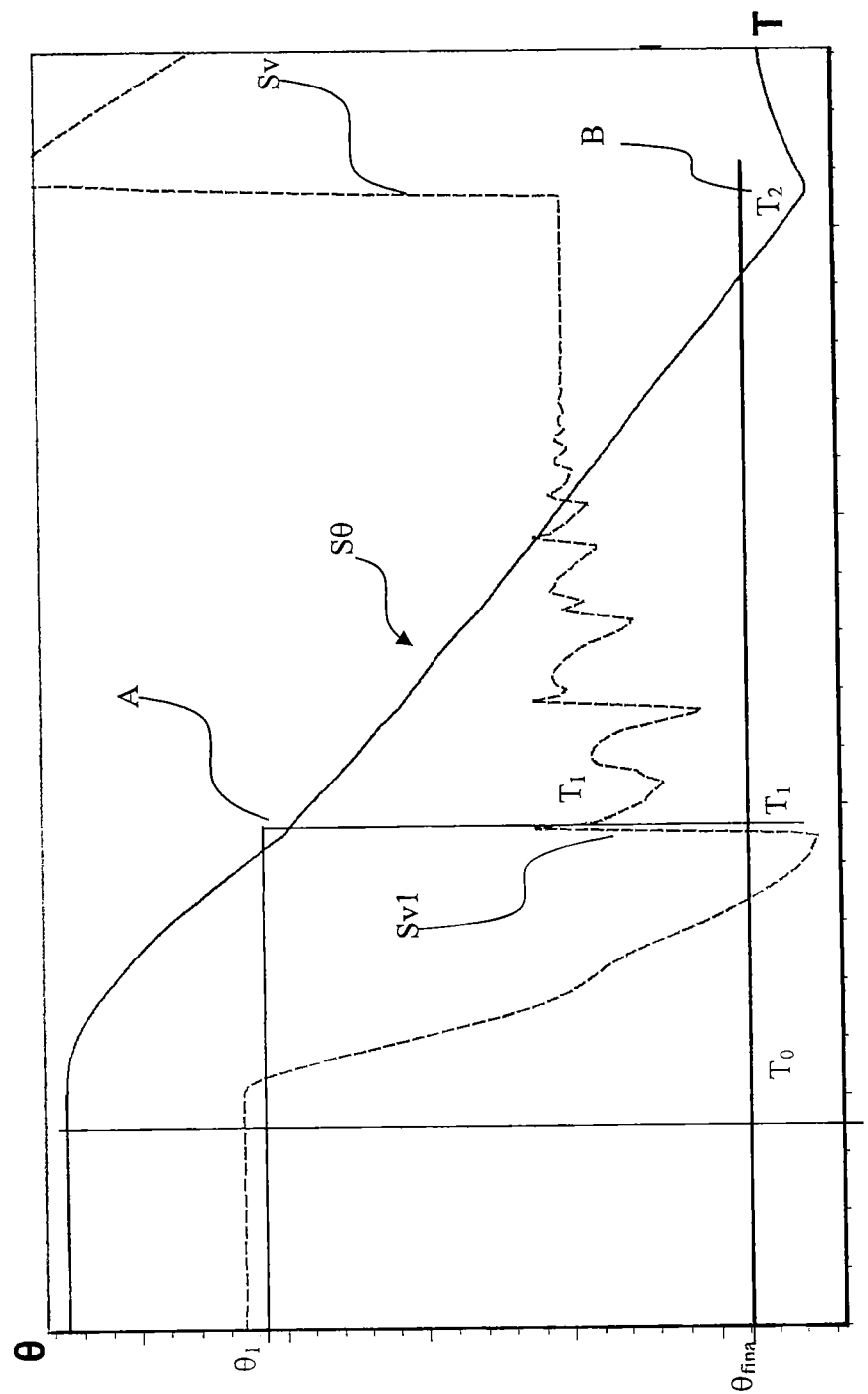
FIG. 7 shows the curves of variation of the angle of rotation and of the speed of rotation of the contact holder poles shaft of the drive mechanism in the process of opening.

As shown in FIG. 7, the method of evaluation of the mechanical performances of a switchgear device during opening is based on the identification of three states corresponding to three angular positions of the poles shaft 20 of the drive mechanism.

Between the closed state and the time of separation of the electrical contacts 12, 14, the drive mechanism 22 is subjected to the force of the contact pressure springs 67 and to the return force of the springs 32. As shown in FIG. 7, the time of separation of the electrical contacts 12, 14 is represented by a first point of inflection A on the curve of variation Sθ of the angle of rotation of the poles shaft 20. The said curve is dependent on the inertia of all of the moving parts, namely the contact fingers, the cages, the poles shaft and the linkage. This assembly of parts is subject to an acceleration, the curve of variation of the angle de rotation of the poles shaft exhibiting a shape defined by a quadratic equation.

After the separation of the electrical contacts 12, 14 (beyond the first point of inflection A), the drive mechanism 22 is subjected only to the return force of the springs 32, this return force being of very low value. The mechanism is no longer subjected to external forces such as the forces of the contact pressure springs 67. As shown, the curve of variation of the angle de rotation of the poles shaft 20 then exhibits a shape defined by a first degree equation. The assembly of moving parts therefore move at a constant speed.

The switchgear device is in an open state when the poles shaft 20 reaches an angular position represented in the curve of variation Sθ of the angle de rotation of the poles shaft 20 by a second point of inflection B. The drive mechanism 22 then comes into contact with a stop. In the present case of the diagnostics, it is temporally the time of a first contact with the said stop, the mechanism exhibiting rebounds after this first contact with the stop.

A diagnostic strategy is based on the identification of this time of separation of the contacts 12, 14, distinguishing the two operating modes of the drive mechanism 22 during the opening.

One way of identification of this time can be to do this via the analysis of the angular velocity of the poles shaft 20 during the opening movement. The angular velocity of the poles shaft 20 is represented by the curve Sv in FIG. 7. At the time of separation of the contacts 12, 14 (first point of inflection A on the curve of variation Sθ of the angle of rotation of the poles shaft 20), as shown in FIG. 7, the velocity profile of the poles shaft Sv exhibits a first sudden variation $S_{v1}$ that can be filtered using the appropriate algorithms.

A first method for diagnosing the wear of the contacts 12, 14 consists in determining the value of the angle $\theta_1$ of rotation of the poles shaft 20 at the time of separation of the contacts 12, 14. The said value of the angle $\theta_1$ of rotation, called the opening angle, tends to diminish with the wear of the contacts 12, 14.

A second method for diagnosing the wear of the electrical contacts 12, 14 consists in measuring the time elapsed between the time T1 of opening of the contacts 12, 14 and the time T2 at which the poles shaft 20 reaches a final angle of rotation $\theta_{final}$. The final angle of rotation $\theta_{final}$ corresponds to the angle reached by the poles shaft when the main pair of mobile contacts 12, 14 is in an open position.

As the wear of the contacts becomes greater, the more the mechanical energy stored in the contact pressure springs 67 tends to diminish when the contact breaker is in a closed position.

Figure 9:
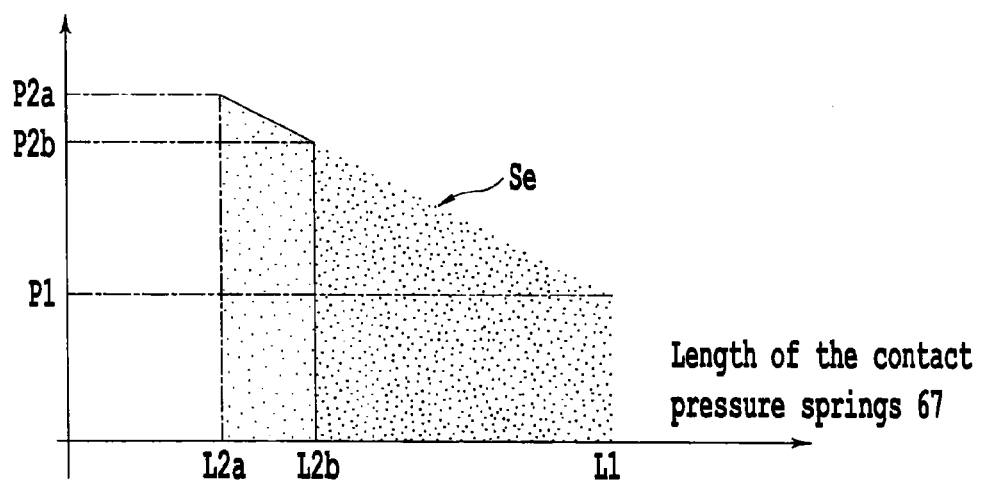
FIG. 9 shows a curve of variation of forces of contact pressure springs as a function of the wear of the contacts.

FIG. 9 shows a straight line of variation Se of the forces P1, P2 of the contact pressure springs 67 as a function of the length of the said contact pressure springs 67. As shown in FIG. 1, the said contact pressure springs 67 are placed between the poles cage 62 and the contact finger 64.

The difference in length of the contact pressure springs 67 between an open position L1 of the switchgear device and a closed position L2 makes it possible to characterize an indicator of the wear of the contacts 12, 14. This indicator is commonly called the contact play L1–L2. The contact play L1–L2 can be expressed in millimeters. The mechanical energy stored in the contact pressure springs 67 is represented by the greyed area of the trapezium contained under the straight line of variation of the contact pressure forces.

The closed positions, referenced L2a and L2b respectively in FIG. 9, correspond to different stages of wear of the electrical contacts 12, 14. With the wear of the contacts, the contact play in the closed position tends to reduce in order to change from a value L1–L2a to a value L1–L2b. Thus, as shown in FIG. 9, the area of the trapezium representing the stored mechanical energy tends to diminish as the wear of the electrical contacts increases.

In the initial operational state, that is to say when the switchgear device is not worn, the mechanical energy stored by the contact pressure springs 67 corresponds to the area of the trapezium defined by the following four vertices: L1, P1, P2a and L2a. As shown in FIG. 9, the area of the said trapezium is expressed by the following formula:

$$\tfrac{1}{2}(P1+P2a)\times(L1-L2)$$

When the contacts are worn, the mechanical energy stored by the contact pressure springs 67 corresponds to the new area of the trapezium defined by the following four vertices: L1, P1, P2$b$ and L2$b$. As shown in FIG. 9, the area of the said trapezium is expressed by the following formula:

$$\tfrac{1}{2}(P1+P2b)\times(L1-L2b)$$

Knowing that P2<P2$b$ and (L1−L2$b$)<(L1−L2), the area of the trapezium L1 P1 P2$b$ L2$b$ is less than that of the trapezium L1 P1 P2 L2.

Thus, the mechanical energy stored by the contact pressure springs 67 tends to diminish with the wear of the said contacts.

During the opening of the said contact breaker, the potential energy of the contact pressure springs 67 is converted into kinetic energy. This energy conversion results in a movement and an acceleration of the drive mechanism 22 until the time of separation of the contacts.

With a reduction of the potential energy due to the wear of the contacts 12, 14 and to the loss of contact play L1−L2, the speeding up (acceleration) of the drive mechanism 22 is slower. The reduction of the kinetic energy of the drive mechanism 22 results in a lengthening of the time necessary for travelling the distance between the closed position and the open position of the contacts 12, 14.

Figure 8:
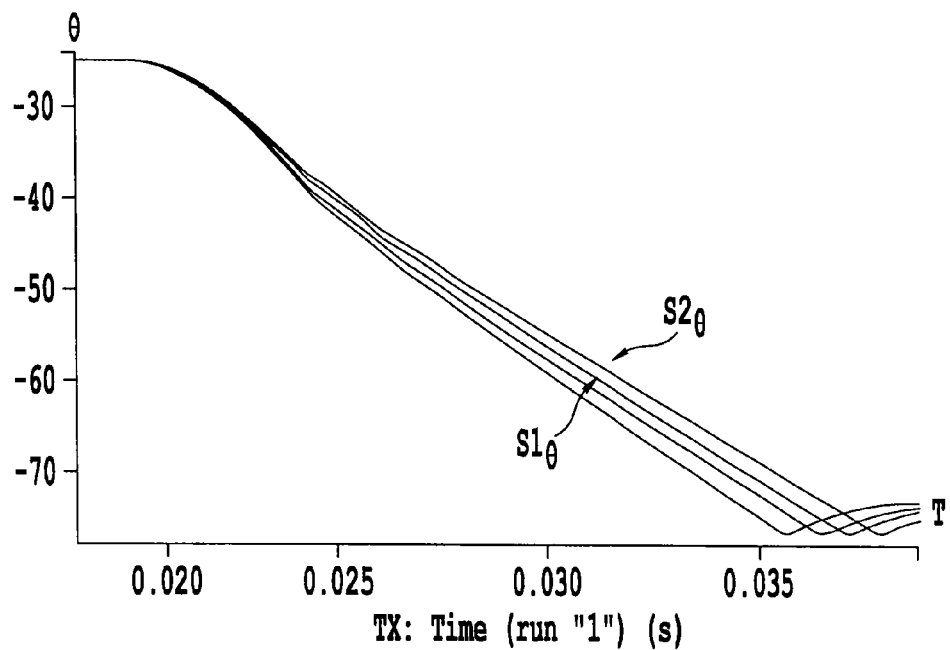
FIG. 8 shows curves of variation of the angle of rotation of the contact holder poles shaft of the drive mechanism in the process of opening for different levels of wear.

FIG. 8 illustrates this phenomenon by showing curves of the variation of the angle of rotation of the poles shaft 20 of drive mechanisms during opening for different levels of wear of the contacts 12, 14. The curve of variation S1$_\theta$ of the angle of rotation $\theta$ in dotted line represents a drive mechanism whose contacts 12, 14 are not worn. The curve of variation S2$_\theta$ of the angle of rotation $\theta$ in continuous line represents a drive mechanism 22 whose contacts 12, 14 are worn.

The method of evaluation of the mechanical performances of a switchgear device notably for diagnosing the wear of the electrical contacts 12, 14 of the said device comprises the following successive steps.

A first step consists in measuring the angle of rotation $\theta$ of the poles shaft 20 over the period of opening the contacts 12, 14 by the drive mechanism 22.

A second step consists in retrieving at least one specific value from the measurements carried out in the preceding step.

According to a first preferred embodiment of the invention, a first method consists in determining a first specific value equal to a first angle $\theta_1$ necessary for reaching a first point of inflection A of a curve of variation S$_\theta$ of the angle of rotation $\theta$ of the poles shaft 20. As shown in FIG. 7, the said point of inflection corresponds to the time at which the poles shaft 20 reaches a maximum speed of rotation and at which is has carried out a rotation through a first angle $\theta_1$. As shown in FIG. 5A, the point of inflection A also corresponds to the time at which the electrical contacts 12, 14 lose contact.

The variation of the value of the angle de rotation $\theta$ of the poles shaft 20 at the time at which the electrical contacts 12, 14 lose contact gives an indication of the wear of the switchgear device. In fact, the operations of the device off load or on load cause wear of the contact pads, whether they are fixed 12 or mobile 14. The wear of the contact pads results in a removal and/or a crushing of material. Moreover, this removal and/or crushing of material tends to shorten the time of separation of the poles and can induce a reduction of the value of the first angle $\theta_1$ of rotation.

The second step of the first method consists in comparing the said specific value with a theoretical reference value extracted from the initial operational specifications of the switchgear device. The said reference value is established as a function of a "mechanical" configuration of the switchgear device. This "mechanical" configuration is notably dependent on the number of poles and on the type of spring 44 of the grenade. The configuration is recorded in order to be used and compared according to the constitution of the switchgear device. This reference value is preferably a product characteristic associated with the switchgear device. This characteristic is therefore provided by the manufacturer. This reference value can also be estimated after a measurement sequence carried out when the device is new. The reference value is recorded in order to be used subsequently in the method according to the invention.

A last step of the method of evaluation of the mechanical performances of a protection device consists in diagnosing the wear of the electrical contacts 12, 14 according to a comparative state between the determined specific value and the theoretical reference value taken from the operational specifications.

According to the particular embodiment of the method, the estimation of the contact play is carried out by the value of the angle $\theta_1$ of rotation of the shaft at the moment the contacts lose contact and the time $T_1$.

According to a second preferred embodiment of the invention, a second method consists in determining a second specific value equal to a first time $T_1$ necessary to reach a first point of inflection A and a third specific value equal to a second time $T_2$ necessary to reach a second point B on the curve of variation S$_\theta$ of the angle of rotation $\theta$. The said second point B corresponds to a theoretical final angle de rotation $\theta_{final}$ reached when the pair of main mobile contacts 12, 14 is in an open position.

The theoretical final angle de rotation $\theta_{final}$ is a theoretical value related to the characteristics of the switchgear device. This value of the angle de rotation is therefore provided by the manufacturer. The said value of the angle de rotation can be estimated after a sequence of measurements carried out when the device is new. The said value of the angle de rotation is recorded in order to be used subsequently in the method according to the invention.

The second step of the second method consists in comparing the said second and third specific values with theoretical reference values extracted from initial operational specifications of the switchgear device. According to a preferred embodiment, the method consists in calculating the elapsed time $\Delta T$ between the first and second times $T_1$, $T_2$. This elapsed time between the first and second times $T_1$, $T_2$ is then compared with a reference value representing operation of a switchgear device that is not worn. These theoretical reference values are established according to the "mechanical" configuration of the switchgear device. This mechanical configuration is notably dependent on the number of poles and on the type of spring of the grenade. The configuration is recorded in order to be used and compared according to the constitution of the switchgear device. These theoretical reference values are preferably product characteristics associated with the switchgear device. The said values are therefore provided by the manufacturer. These reference values can also be estimated after a measurement sequence carried out when the device is new. The reference values are recorded in order to be used subsequently in the method according to the invention.

A last step of the method of evaluation of the mechanical performances of a protection device consists in diagnosing the wear of the electrical contacts 12, 14 according to a comparative state between the determined specific values and the reference values taken from the operational specifications.

In other words, the last step of the two methods according to the invention provides information on the wear of the main contacts 12, 14.

According to a particular development, the sensor 70 is preferably located on the poles shaft 20 out of the areas likely to be polluted during the contact breaks by debris and far from possible jets of hot gasses. Switchgear devices 10 having high electrodynamic strength have a service life which can be as long as about thirty years; advantageously, the sensor 70 is of the no contact type in order to limit any bias due to wear or friction within the sensor 70.

As shown in FIGS. 3 and 4, the rotation sensor 70 comprises a toothed wheel 112 or a portion of toothed wheel disposed on the poles shaft 20. In another embodiment, which is not shown, the wheel is constituted by a succession of magnetic poles. Detection means 114 such as microelectronic devices using sensitive elements of the inductive type, Hall Effect cells, or magneto-resistive cells, are positioned on the casing of the switchgear device 10, opposite the toothed wheel or the magnetic poles. The toothed wheel 112 and the detection means 114 communicate without contact. Preferably, the detection means 114 incorporate digital methods of processing the analogue signals generated by the passing of the teeth of the toothed wheel or the passing of the magnetic poles, in order to give a digital transcription of them in the form of square signals offset by a quarter of a period. In a certain type of embodiment, the detection means can integrate functions of interpolation of the analogue signals.

Figure 6:
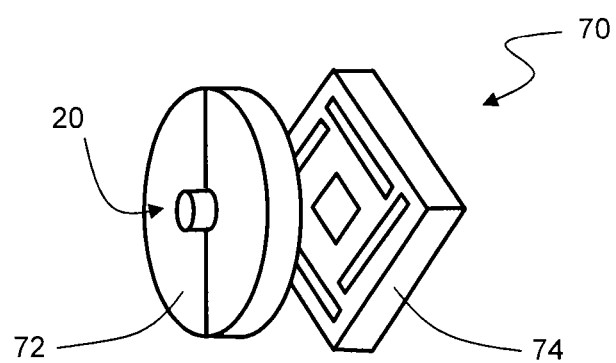
FIG. 6 shows a sensor used in a particular embodiment of the invention.

According to a second particular development, which is not shown, the sensor 70, of small volume, is preferably located at the end of the shaft 20, for example at an end close to the casing of the switchgear device 10. In particular, a magnetic sensor with no sliding contact, notably a magnetic array type rotation sensor, is particularly suitable due to its absence of parts likely to degrade rapidly. As shown in FIG. 6, this type of sensor 70 comprises magnetic means 72, notably a magnet, which can be firmly attached to the element of which it is desired to determine the rotation; in particular, the magnet 72 can be directly coupled to the poles shaft 20 by bonding to its end or by any other mechanical means. The sensor 70 furthermore comprises detection means 74, and notably a detector of the printed circuit board type with a side dimension of about 4 mm; the detector 74 is positioned opposite the magnetic means 72, for example coupled to the casing of the switchgear device 10, notably placed in a suitable housing. The detector 74 is connected in a conventional manner to means of processing data and of presentation of the results, for example an electronic module already present on the switchgear device 10 and to which a new function is added. Advantageously, the sensor 70 is such as described in the documents EP 1 830 162 or EP 1 921 423, with an angular resolution of the order of 0.2 to 0.5°.

Although the invention has been described with reference to contacts 12, 14 of a switchgear device 10 having high electrodynamic strength in which the drive mechanism 22 involves a large variation of the angular position of the poles shaft 20 for a small variation of the excess crushing travel, it is not limited to it: it can relate to other types of switchgear devices, contactors and/or circuit breakers. If the decoupling of the movements by double link and toggle amplifies the angular difference depending on whether or not the contacts are worn, depending on the travel of the contacts and depending on the precision of the detection device 70, it is possible to apply the device according to the invention to other drive mechanisms comprising a rotary part.

According to a variant embodiment that is not shown, a sensor measures the rotation of the poles cage 62 between the start of the movement of the poles shaft 20 and the end of travel of the said shaft 20. The end of travel of the poles shaft 20 corresponds to the open position of the electrical contacts.

The invention claimed is:

1. A method for evaluating mechanical performances of a switchgear device comprising at least one pole, each pole comprising:
   a pair of contacts that are mobile with respect to each other between an open position and a closed position;
   a support arm for a first contact;
   a drive mechanism configured to drive the support arm, comprising:
      a rotary poles shaft and at least one rod which couples the drive mechanism to the support arm in a pivoting manner,
      an energy accumulator configured to drive a movement of the said arm in order to place the contacts in an open position;
   wherein the method comprises:
      measuring an angle of rotation of the poles shaft over a period of opening the contacts;
      retrieving from the measurements at least one specific value depending on a first point of inflection on a curve of variation of the angle of rotation of the poles shaft, the said point of inflection corresponding to the time at which the poles shaft reaches a maximum speed of rotation and where the electrical contacts lose contact;
      comparing the said specific value with initial operational specifications of the switchgear device;
      diagnosing the mechanical wear performances of the drive mechanism as a function of a comparative state between the specific values obtained and those of the operational specifications.

2. The method according to claim 1, further comprising:
   determining a first specific value equal to a first angle necessary for reaching the first point of inflection;
   comparing the said specific value with a theoretical reference value extracted from specific initial operational specifications of the switchgear device;
   diagnosing the wear of electrical contacts according to a comparative state between the determined specific value and the theoretical reference value taken from the operational specifications.

3. The method according to claim 1, further comprising:
   determining a second specific value equal to a first time necessary for reaching the first point of inflection;
   determining a third specific value equal to a second time necessary for reaching a second point on the curve of variation of the angle of rotation, the said second point corresponding to a theoretical final angle of rotation reached when the main pair of mobile contacts is in an open position;
   calculating the time elapsed between the first and second times;
   comparing the time elapsed between the first and second times with a reference value representing the operation of a switchgear device that is not worn;
   diagnosing the wear of the electrical contacts as a function of a comparative state between the determined specific values and the reference values taken from the operational specifications.

4. A switchgear device configured to perform the method according to claim 1, the switchgear device comprising:
   the pair of contacts that are mobile with respect to each other between the open position and the closed position;
   the support arm for the first contact;
   the drive mechanism configured to drive the support arm, comprising:

the rotary poles shaft and the at least one rod which couple the drive mechanism to the support arm in the pivoting manner, and the energy accumulator configured to drive the movement of the said arm in order to place the contacts in the open position; and a plurality of identical poles and a poles shaft common to all of the poles, the poles shaft being the axis of rotation of the drive mechanisms.

5. The switchgear device according to claim 4, wherein the support arm of a first contact comprises a first part carrying the first contact and a second part, the two parts sliding with respect to each other so that, in the closed position of the pair of contacts, the second part can take up a first docking position and a second end of travel position in which the first part is inserted in the second part.

6. The switchgear device according to claim 4, wherein the drive mechanism of the poles shaft comprises a toggle device coupled with a tripping hook and an opening spring in order to move the support arm of the mobile contact, the device comprising two rods.

7. The switchgear device according to claim 4, wherein the drive mechanism of the poles shaft comprises a reset device having an energy accumulator system with an elastic device comprising at least one closing spring in order to move the mobile contact towards the closed position, the setting of the closing spring being operated by a resetting cam driven in rotation by at least one of means of a manual lever or a servomotor.

8. The switchgear device according to claim 4, further comprising a rotation sensor configured to determine an angle of rotation of the poles shaft, wherein the rotation sensor includes a component that is disposed on the poles shaft.

9. The switchgear device according to claim 8, wherein the rotation sensor comprises a magnet disposed on the axis of rotation and a first detector positioned on the casing of the switchgear device, wherein the magnet and the first detector are configured to communicate without contact.

10. The switchgear device according to claim 8, wherein the rotation sensor comprises a toothed wheel disposed on the axis of rotation and a second detector placed on the casing of the switchgear device, wherein the toothed wheel and the second detector are configured to communicate without contact.

\* \* \* \* \*